United States Patent
Pan et al.

(10) Patent No.: US 9,330,915 B2
(45) Date of Patent: May 3, 2016

(54) SURFACE PRE-TREATMENT FOR HARD MASK FABRICATION

(71) Applicant: Taiwan Semiconductor Manufacturing Co., Ltd., Hsin-Chu (TW)

(72) Inventors: Shing-Chyang Pan, Jhudong Township (TW); Ching-Hua Hsieh, Hsinchu (TW); Hong-Hui Hsu, Zhubei (TW); Yao-Jen Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/102,072

(22) Filed: Dec. 10, 2013

(65) Prior Publication Data
US 2015/0162280 A1    Jun. 11, 2015

(51) Int. Cl.
*H01L 21/033* (2006.01)
*H01L 21/768* (2006.01)
*H01L 23/532* (2006.01)

(52) U.S. Cl.
CPC ........ *H01L 21/0337* (2013.01); *H01L 21/0332* (2013.01); *H01L 21/7684* (2013.01); *H01L 21/76807* (2013.01); *H01L 21/76877* (2013.01); *H01L 21/76883* (2013.01); *H01L 23/53295* (2013.01); *H01L 23/53238* (2013.01); *H01L 2924/0002* (2013.01)

(58) Field of Classification Search
CPC .......................... H01L 23/48; H01L 21/76807
USPC ............... 257/86, 774; 438/704, 653, 637
See application file for complete search history.

(56) References Cited

U.S. PATENT DOCUMENTS

| | | | |
|---|---|---|---|
| 6,969,683 B2 * | 11/2005 | Hu et al. ................. | 438/697 |
| 7,282,436 B2 * | 10/2007 | Jiang et al. ............. | 438/622 |
| 7,507,660 B2 * | 3/2009 | Chen et al. .............. | 438/652 |
| 7,759,251 B2 * | 7/2010 | Geffken et al. ......... | 438/700 |
| 8,071,167 B2 | 12/2011 | Kher et al. | |
| 2003/0013311 A1 * | 1/2003 | Chang et al. ........... | 438/704 |
| 2003/0100188 A1 | 5/2003 | Huang et al. | |
| 2003/0186534 A1 | 10/2003 | Nambu | |
| 2004/0121585 A1 | 6/2004 | Liu et al. | |
| 2005/0142847 A1 | 6/2005 | Ryu | |
| 2006/0046502 A1 | 3/2006 | Ngo et al. | |
| 2008/0184543 A1 * | 8/2008 | Sako et al. ............. | 29/25.02 |
| 2009/0246713 A1 | 10/2009 | Zin et al. | |
| 2010/0327412 A1 | 12/2010 | Lee et al. | |

(Continued)

OTHER PUBLICATIONS

P. Josh Wolf, et al.; "Overview of Dual Damascene Cu/Low-k Interconnect"; ERC Retreat Stanford: New Chemistries & Tools for scCO2 Processing of Thin Films; International Sematech; Aug. 14, 2003; p. 1-21.
U.S. Appl. No. 14/102,090, filed Dec. 10, 2013.
Non Final Office Action Dated May 8, 2015 U.S. Appl. No. 14/102,090.
Final Office Action Dated Nov. 5, 2015 U.S. Appl. No. 14/102,090.

(Continued)

*Primary Examiner* — Yu-Hsi D Sun
(74) *Attorney, Agent, or Firm* — Eschweiler & Associates, LLC

(57) ABSTRACT

A robust metallization profile is formed by pre-treat an anti-reflective coating layer by plasma before forming a hard mask layer. Pre-treatment is helpful especially in small feature size process, for example, 50 nm and below. By changing constitution of a surface layer of the anti-reflective coating, interface of the anti-reflective coating layer and the hard mask layer is smoothed which results in less overhang and better gap-filling performance.

18 Claims, 6 Drawing Sheets

(56) References Cited

U.S. PATENT DOCUMENTS

2012/0205814 A1\* 8/2012 Wu et al. .................. 257/774
2013/0095652 A1 4/2013 Harada et al.

OTHER PUBLICATIONS

Notice of Allowance Dated Feb. 17, 2016 U.S. Appl. No. 14/102,090.
English translation of Korean Office Action dated Jan. 14, 2016 for co-pending Korean Application No. 10-2014-0177840.

\* cited by examiner

SURFACE PRE-TREATMENT FOR HARD MASK FABRICATION

BACKGROUND

As dimensions of semiconductor integrated circuit are scaled down, hard masks are utilized in processes. Hard masks have a high etch selectivity and help provide a high quality anisotropic etching to transfer patterns.

Some approaches are developed to improve performance of hard masks. Among those are techniques to remove hard masks with less damage introduced, techniques to clean residue after removal of hard masks, and tuning stress in the hard mask.

DETAILED DESCRIPTION

Figure 1:
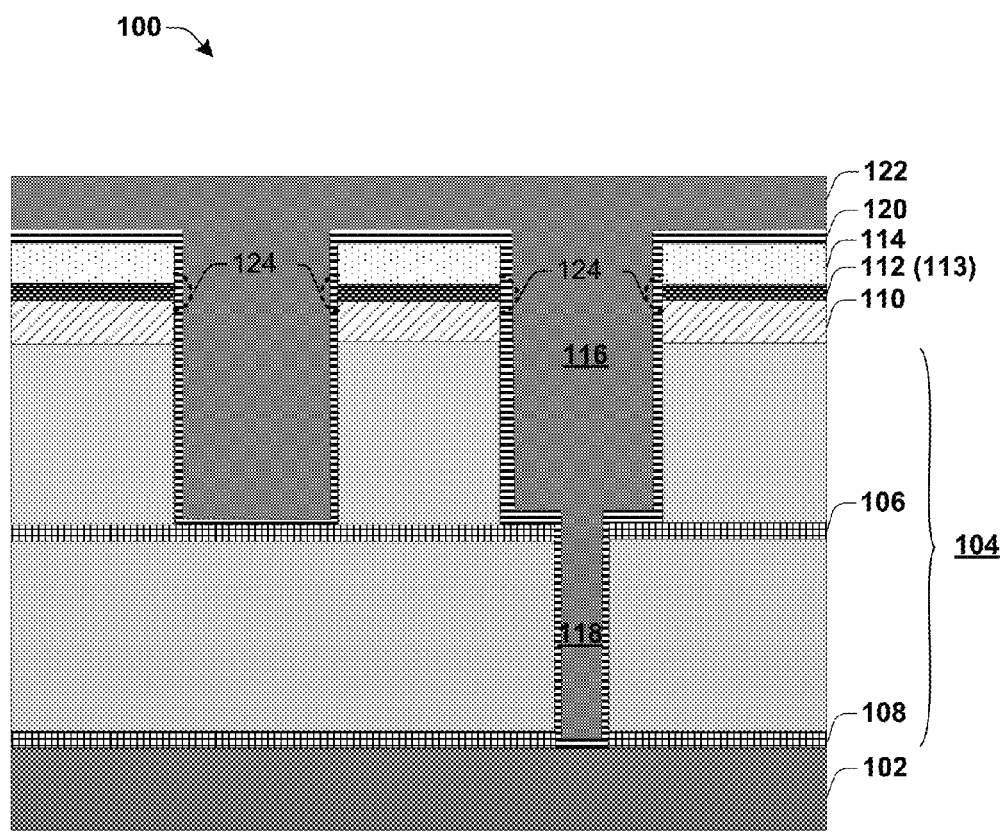
FIG. 1 illustrates a cross-sectional view of a dual damascene structure in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the Figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Usage of a hard mask layer introduces high etch selectivity which helps to transfer patterns. The hard mask layer is usually disposed on a dielectric layer, for example, an anti-reflective coating (ARC) layer. Due to differences between etching rates of the hard mask layer and the dielectric layer underneath, it has been discovered that nodules may be formed during a pattern process and followed etching processes. Negative effects of these nodules become significant in small feature size processes, for example, 50 nm and below. With decreasing feature size, the requirement of smooth interfaces between each two layer becomes very high so that a subsequently formed conductive seed layer and a conductive layer above the conductive seed layer will form interconnects successfully. A smooth interface between the hard mask layer and the dielectric layer underneath is formed by a pre-treatment of the dielectric layer before forming the hard mask layer. By changing the constitution of a pre-treated surface layer of the dielectric layer, one of the improvements is that etching rates of the hard mask layer and the pre-treated surface layer become approximately similar. As a result, less overhang and better gap-filling performance are reached for formation of conductive interconnnects.

FIG. 1 illustrates a cross-sectional view of a dual damascene structure 100 in accordance with some embodiments. A low-k dielectric layer 104 is over a substrate 102, such as a bulk silicon wafer, a binary compound substrate (e.g., GaAs wafer), or higher order compound substrates, with or without additional insulating or conducting layers formed thereover, among others. In some embodiments, a first etch stop layer (ESL) 106 and/or a second etch stop layer 108 can be formed in the porous low-k dielectric layer 104. The low-k dielectric material could be porous material. A trench structure 116 is stopped on the first ESL 106 and a via structure 118 is stopped on the second ESL 108 in etching processes in the low-k dielectric layer 104. An anti-reflective coating (ARC) layer 110 which is nitrogen free is over the porous low-k dielectric layer 104. By keeping an interface between the porous low-k dielectric layer 104 and the ARC layer 110 nitrogen free, very little nitrogen can diffuse into the pores of low-k dielectric layer 104 to introduce contamination. A pre-treated surface layer 112 containing nitrogen (for example, from about 5% to about 20%) is on top of the ARC layer 110. A hard mask layer 114, for example, a TiN layer, Oxide-Nitride-Oxide (ONO) layer, or Nitride Silicon Oxide (SiON) layer, is disposed over the pre-treated surface layer 112 and ARC layer. A first etch rate of the hard mask layer 114 and a second etch rate of the pre-treated surface layer 112 are similar so that fewer nodules will be formed during the etching process as compared to a conventional situation where the hard mask layer 114 directly overlied the ARC layer 110. A conductive seed layer 120 is formed over the side walls of the trench structure 116 and the via structure 118. A conductive layer 122 is formed on the conductive seed layer 120. For explanation purposes, a dotted line 124 shows some positions of possible nodules which become smooth with the embodiments shown in FIG. 1.

In some embodiments, instead of pre-treat the ARC layer 110 to form the pre-treated surface layer 112, an interface layer 113 is formed between the ARC layer 110 and the metal hard mask layer 114. Similar to the pre-treated surface layer 112, the interface layer contains nitrogen (for example, from approximately 10% to approximately 30%) to form a smooth interface with the metal hard mask layer 114. Furthermore, different from the TiN metal hard mask layer 114 and the anti-reflective coating layer 110 for trench patterning, a second hard mask layer and a corresponding pre-treated dielectric layer underneath can be disposed for via patterning.

Figure 2:
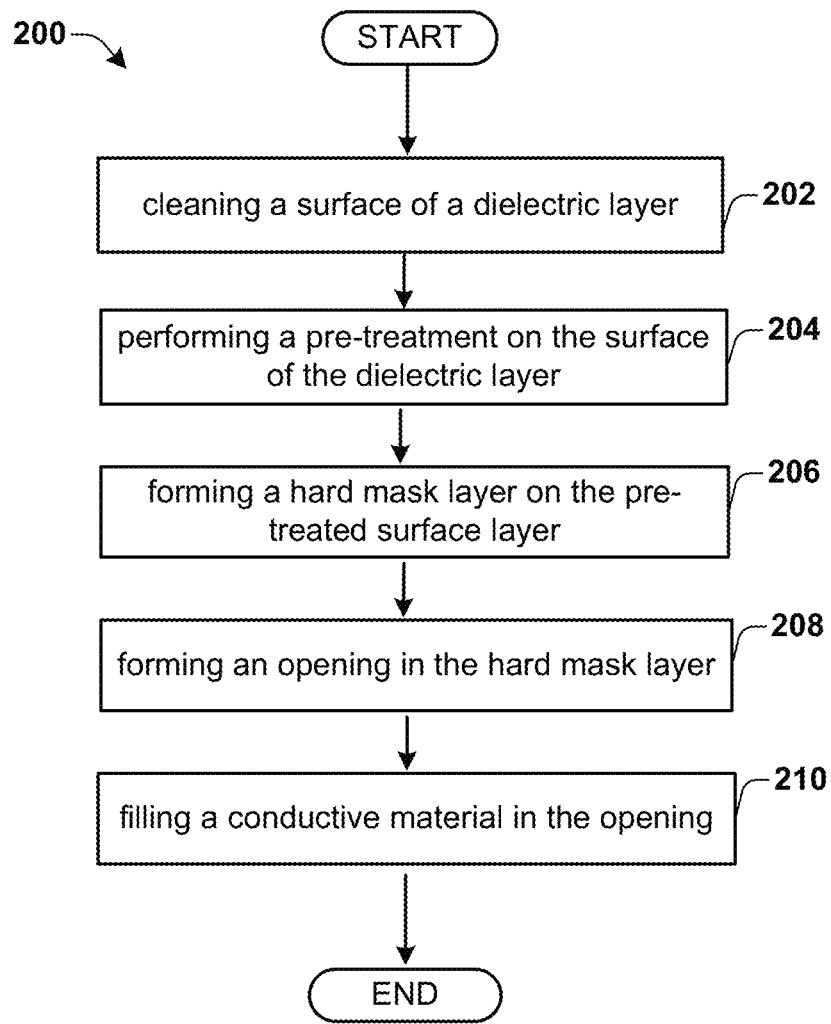
FIG. 2 illustrates a flow diagram of some embodiments of methods for forming a hard mask layer on a dielectric layer.

FIG. 2 illustrates a flow diagram 200 of some embodiments of methods for forming a hard mask layer on a dielectric layer.

At 202, a surface of a dielectric layer is cleaned to prepare for the surface pre-treatment thereafter. The dielectric layer can be an anti-reflective coating (ARC) layer.

At 204, a pre-treatment is performed to the surface of the dielectric layer to form a pre-treated surface layer. The pre-treatment can be performed in some embodiments by exposing the dielectric layer to plasma containing N2, NH3, or N-contented. The pre-treatment can be formed in separated chamber from deposition or in the same deposition chamber. The plasma can be generated, for example, by Direct Current (DC), Radio Frequency (RF), Inductively Coupled Plasma (ICP), Capacitively Coupled Plasma (CCP) or microwave. An operation pressure can be from approximately 5 mT to approximately 50 mT. In some embodiments, the pre-treatment is formed by a RF power of approximately 500 W to approximately 3000 W. A treat time is larger than approximately 5 s.

At 206, a hard mask layer which comprises metal, for example, TiN, is formed on the pre-treated surface layer. TiN is used as a hard mask for trench first patterning approach in ULSI Back End Of Line (BEOL) in some embodiments.

At 208, an opening is formed in the hard mask layer downward to a etch stop layer.

At 210, a conductive material is filled in the opening.

Figure 3:
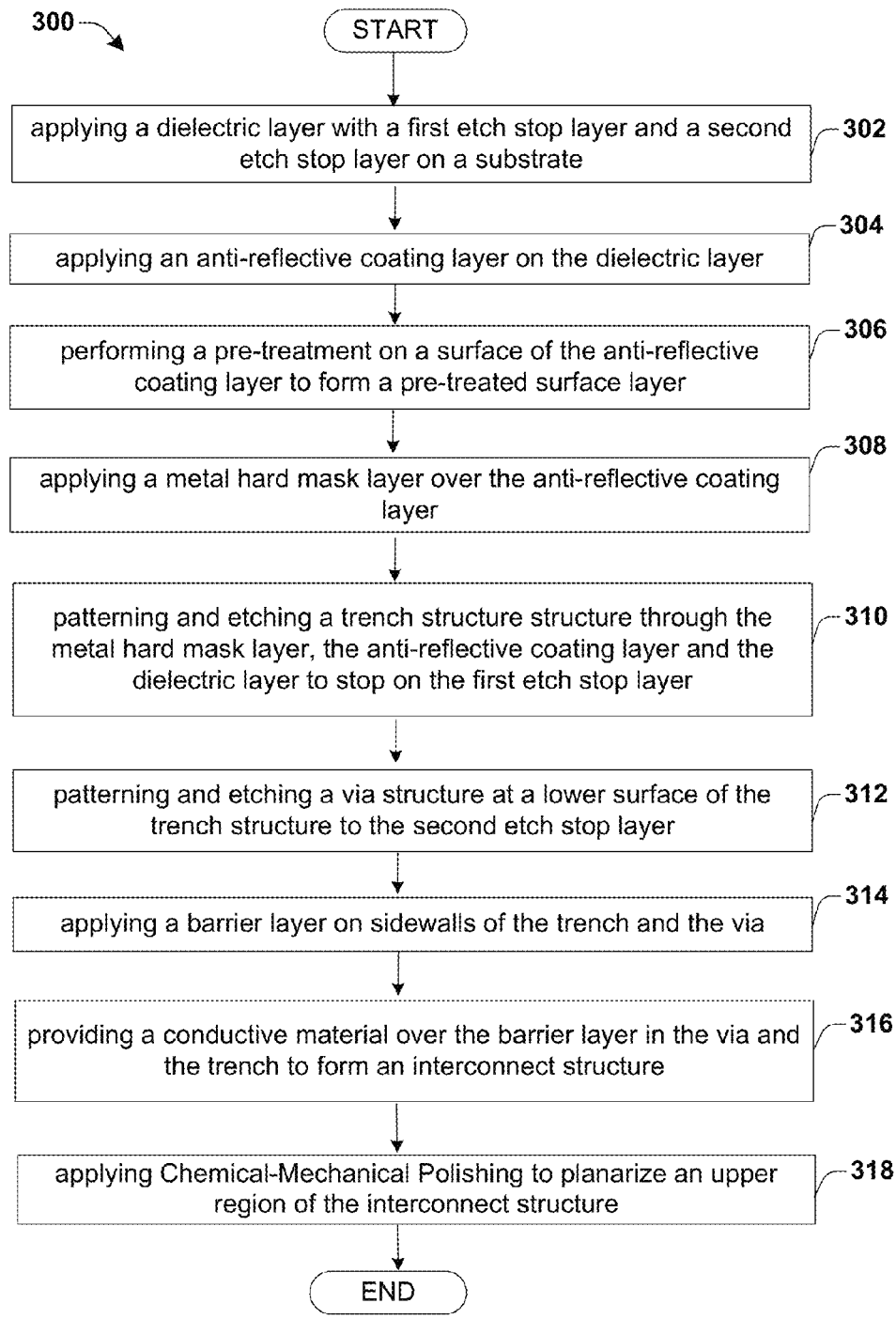
FIG. 3 illustrates a flow diagram of some embodiments of methods for forming a robust metallization profile.

FIG. 3 illustrates a flow diagram 300 of some embodiments of methods for forming a robust metallization profile. While disclosed methods (e.g., methods 300 of FIG. 3) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a dielectric layer with a first etch stop layer and a second etch stop layer is formed on a substrate. The dielectric layer can be a porous low-k material.

At 304, an anti-reflective coating layer is formed over the dielectric layer.

At 306, a pre-treatment is performed on a surface of the anti-reflective coating layer to form a pre-treated surface layer. The pre-treatment can be performed by exposure of the ARC layer to a plasma containing nitrogen.

At 308, a metal hard mask layer is formed over the anti-reflective coating layer on the pre-treated surface layer.

At 310, a trench structure is patterned and etched through the metal hard mask layer, the anti-reflective coating layer and the dielectric layer to stop on the first etch stop layer.

At 312, a via structure is patterned and etched at a lower surface of the trench structure to stop on the second etch stop layer. Notably, 310 and 312 can occur in different orders. Via first then trench process, trench first then via process or self-aligned process can be formed to the example embodiments.

At 314, a seed layer is formed over sidewalls of the trench and the via. The seed layer can be formed by deposition, for example, CVD, PVD, or spin-coat.

At 316, a conductive material for example, copper, is provided over the seed layer in the via and the trench to form an interconnect structure. The conductive material can be formed by electroplating, for example.

At 318, Chemical-Mechanical Polishing (CMP) is formed to planarize an upper region of the interconnect structure.

One example of FIG. 3's method is now described with regards to a series of cross-sectional views as shown in FIGS. 4a-4i. Although FIGS. 4a-4i are described in relation to method 300, it will be appreciated that the structures disclosed in FIGS. 4a-4i are not limited to such a method, but instead may stand alone as a structure.

Figure 4A:
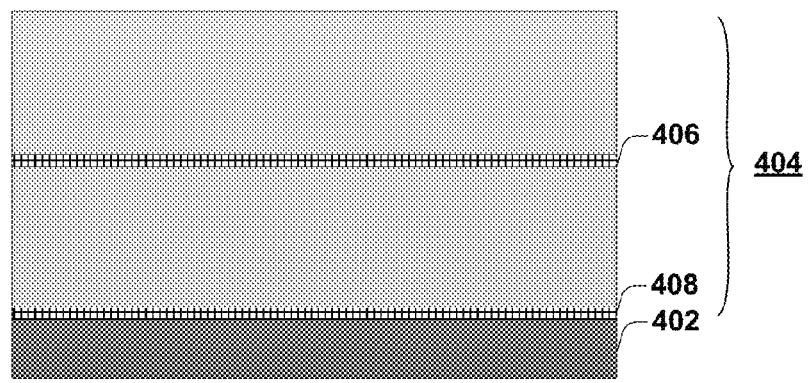
FIGS. 4a-4i illustrate cross-sectional views of some embodiments of a method of forming a robust metallization profile.

At FIG. 4a, a dielectric layer 404 with a first etch stop layer 406 and a second etch stop layer 408 is formed on a substrate 402. The substrate 402 may comprise any type of semiconductor material including a bulk silicon wafer, a binary compound substrate (e.g., GaAs wafer), or higher order compound substrates, with or without additional insulating or conducting layers formed thereover, among others. One example of the dielectric layer 404 is a porous low-k layer has a thickness of from about 1200 Å to about 1500 Å. The porous low-k layer is formed, for example, by CVD.

Figure 4B:
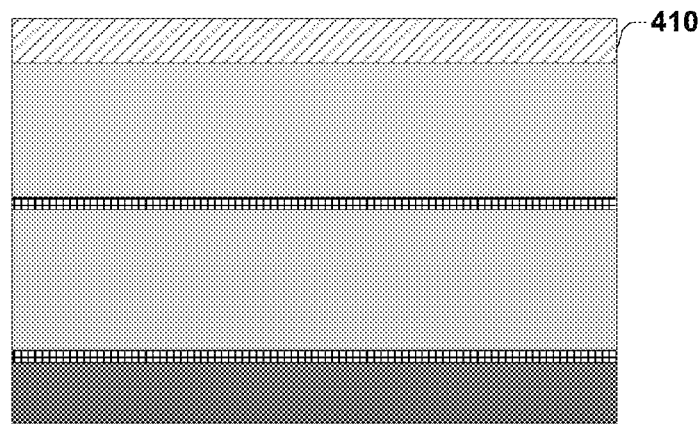

At FIG. 4b, an anti-reflective coating (ARC) layer 410 is formed over the dielectric layer 404. In some embodiments, the ARC layer 410 has a thickness of from about 150 Å to about 300 Å.

Figure 4C:
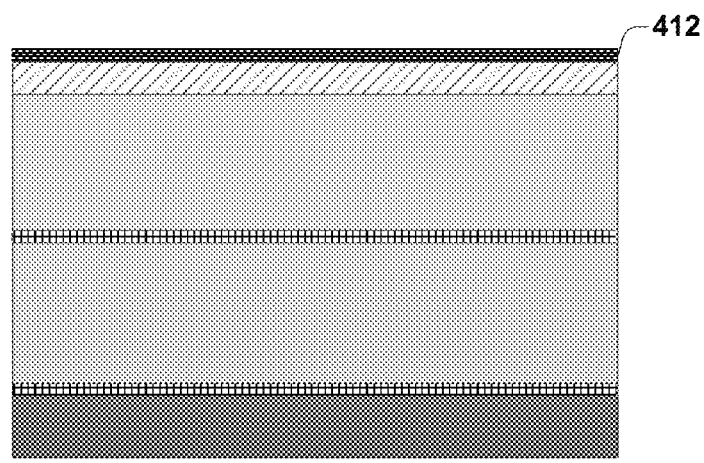

At FIG. 4c, a pre-treatment is formed on a surface of the anti-reflective coating layer to form a pre-treated surface layer 412.

Figure 4D:
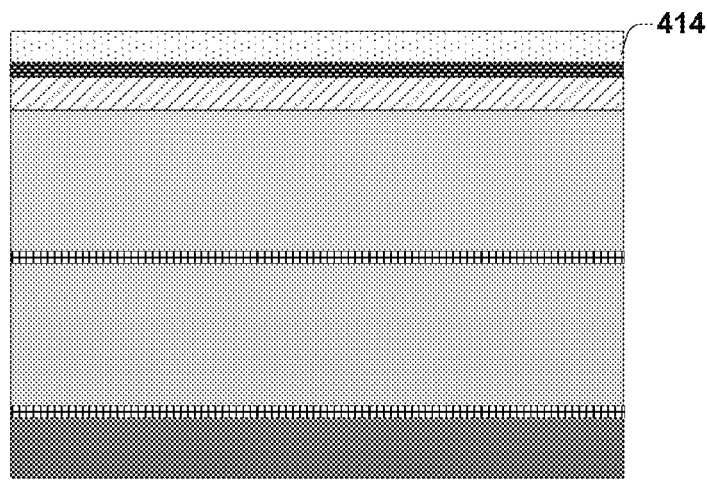

At FIG. 4d, a metal hard mask layer 414 is formed on the pre-treated surface layer 412. In some embodiments, the metal hard mask layer 413 is TiN has a thickness of from about 300 Å to about 400 Å.

Figure 4E:
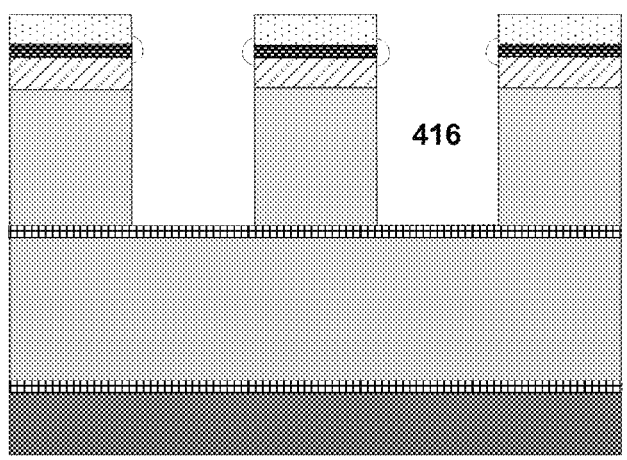

At FIG. 4e, a trench structure 416 is patterned and etched through the metal hard mask layer 414, the anti-reflective coating layer 410 and the dielectric layer 404 to stop on the first etch stop layer 406.

Figure 4F:
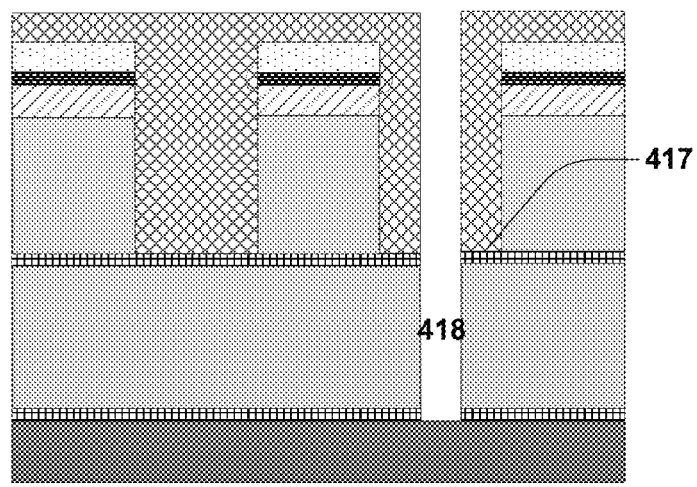

At FIG. 4f, a via structure 418 is patterned and etched at a lower surface 417 of the trench structure to stop on the second etch stop layer 408. An opening size of the via in some embodiments is 50 nm or less.

Figure 4G:
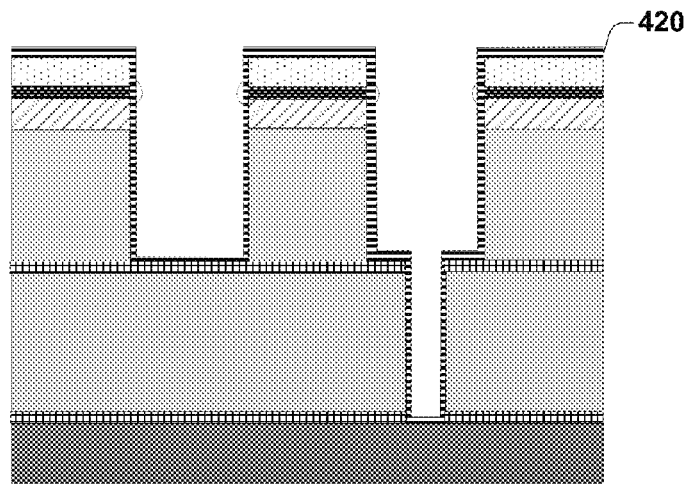

At FIG. 4g, a seed layer 420 is formed on sidewalls of the trench 416 and the via 418. A barrier layer (not shown) is formed first to prevent diffusion of conductive material from the seed layer into the dielectric layer 404. In some embodiments, the barrier layer comprises TaN and Ta.

Figure 4H:
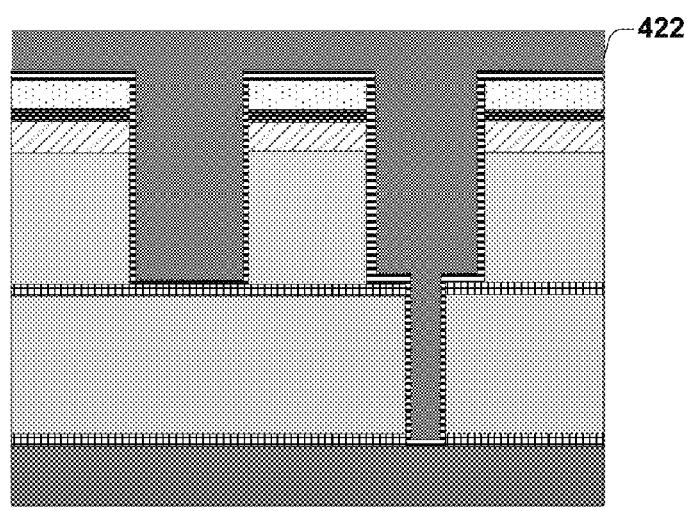

At FIG. 4h, a conductive material 422 is provided over the seed layer 420 in the via 418 and the trench 416 to form an interconnect structure.

Figure 4I:
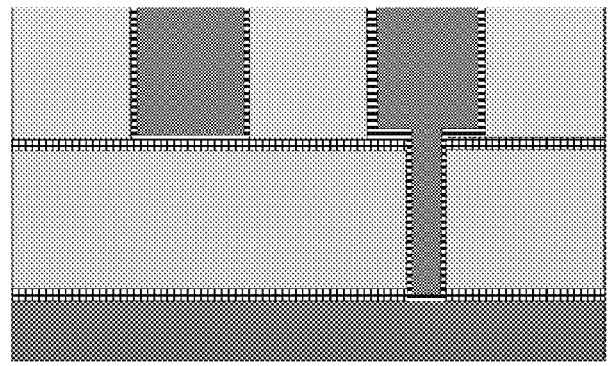

At FIG. 4i, Chemical-Mechanical Polishing (CMP) is formed to planarize an upper region 424 of the interconnect structure.

Thus, some embodiments relate to a method for forming a hard mask layer on a dielectric layer. In this method, a pre-treatment is performed on the surface of the dielectric layer to form a pre-treated surface layer. A hard mask layer is in succession formed on the pre-treated surface layer.

Other embodiments relate to a method for forming a robust metallization profile. In this method, a dielectric layer with a first etch stop layer and a second etch stop layer is formed on a substrate. An anti-reflective coating layer is formed on the dielectric layer. A pre-treatment is performed on a surface of the anti-reflective coating layer to form a pre-treated surface layer. A metal hard mask layer is formed over the pre-treated surface layer. A trench structure is patterned and etched through the metal hard mask layer, anti-reflective coating layer and the dielectric layer to stop on the first etch stop layer while a via structure is patterned and etched at a lower surface of the trench structure to the second etch stop layer. A barrier layer is formed on sidewalls of the trench and the via. A conductive material is provided over the barrier layer in the via and the trench to form an interconnect structure. At last, Chemical-Mechanical Polishing (CMP) is formed to planarize an upper region of the interconnect structure.

Still another embodiment relates to a dual damascene structure. The dual damascene structure comprises a silicon substrate, a porous low-k dielectric layer with a first etch stop layer and a second etch stop layer on the silicon substrate, a via and a trench structure disposed in the porous low-k dielectric layer, an anti-reflective coating (ARC) layer over the porous low-k dielectric layer, a pre-treated surface layer on the ARC layer, a TiN metal hard mask layer on the pre-treated surface layer, and a conductive layer filling the via and the trench. The pre-treated surface layer includes nitrogen and the ARC layer includes substantially no nitrogen.

It will be appreciated that while reference is made throughout this document to example structures in discussing aspects of methodologies described herein (e.g., the structure presented in FIGS. 4a-4i, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the FIGS. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the Figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for forming a robust metallization profile, comprising:
    forming a dielectric layer with a first etch stop layer and a second etch stop layer on a substrate,
    forming an anti-reflective coating layer on the dielectric layer,
    performing a pre-treatment using a N-containing plasma on a surface of the anti-reflective coating layer to form a pre-treated surface layer, and
    forming a metal hard mask layer over the pre-treated anti-reflective coating layer.

2. The method of claim 1 further comprising:
    patterning and etching a trench structure through the metal hard mask layer, the pre-treated surface layer, the anti-reflective coating layer and the dielectric layer to stop on the first etch stop layer,
    patterning and etching a via structure at a lower surface of the trench structure to the second etch stop layer,
    forming a seed layer over sidewalls of the trench and the via,
    providing a conductive material over the seed layer in the via and the trench to form an interconnect structure, and
    forming Chemical-Mechanical Polishing (CMP) to planarize an upper region of the interconnect structure.

3. The method of claim 2, wherein the via has an opening size of 50 nm or less.

4. The method of claim 2, wherein etching of the via is prior to or after etching of the trench.

5. The method of claim 2, wherein the conductive material is copper.

6. The method of claim 2, wherein the interconnect is formed by depositing the seed layer and electroplating metal.

7. The method of claim 1, wherein the dielectric layer is porous low-k material.

8. The method of claim 1, wherein the pre-treatment forms a nitrogen-containing interface layer on the surface of the anti-reflective coating layer, and wherein the metal hard mask layer is formed directly on the nitrogen-containing interface layer.

9. The method of claim 8, wherein the nitrogen containing interface layer contains between approximately 10% and approximately 30% nitrogen by weight.

10. A method, comprising:
    receiving a semiconductor substrate;
    forming a first etch stop layer over the substrate;
    forming a first low-k dielectric layer over the first etch stop layer, wherein the first low-k dielectric layer meets the first etch stop layer at a first interface;
    forming a second etch stop layer over the first low-k dielectric layer, wherein the second etch stop layer meets the first low-k dielectric layer at a second interface;
    forming a second low-k dielectric layer over the second etch stop layer, wherein the second low-k dielectric layer meets the second etch stop layer at a third interface;
    forming an anti-reflective coating layer on the second low-k dielectric layer;
    performing a pre-treatment process, which contains nitrogen, on a surface of the anti-reflective coating layer to form a pre-treated surface layer that includes nitrogen therein;
    forming a metal hard mask layer over the pre-treated surface layer; and
    patterning the metal hard mask layer and, with the patterned hard mask layer in place, performing an etch through the pre-treated surface layer, the anti-reflective coating layer, and the second low-k dielectric layer to form a trench opening having a lowermost trench opening region that exposes the second etch stop layer.

11. The method of claim 10, further comprising:
    patterning and etching the second etch stop layer and first low-k dielectric layer to to form a via opening, which extends downward from the trench opening and which terminates on the first etch stop layer.

12. The method of claim 11, further comprising:
    forming a conformal seed layer over sidewalls of the trench opening and over sidewalls and a bottom surface of the via opening;
    with the conformal seed layer in place, electroplating copper to form a dual damascene structure which fills the trench opening and the via opening.

13. The method of claim 12, further comprising:
    performing Chemical-Mechanical Polishing (CMP) to planarize an upper region of the dual damascene structure.

14. The method of claim 11, wherein the pre-treated surface layer contains between approximately 10% and approximately 30% nitrogen by weight.

15. The method of claim 11, wherein the metal hard mask layer is TiN.

16. The method of claim 11, wherein the metal hard mask layer is Oxide-Nitride-Oxide (ONO).

17. The method of claim 11, wherein the metal hard mask layer is Silicon Oxinitrde (SiON).

18. The method of claim 11, wherein the pre-treatment is performed by exposing the surface of the anti-reflective coating layer to a plasma.

* * * * *